United States Patent [19]

Tochikubo et al.

[11] 4,343,829
[45] Aug. 10, 1982

[54] METHOD OF FABRICATING SINGLE-CRYSTALLINE SILICON FILMS

[75] Inventors: Hiroo Tochikubo, Tokyo; Akira Kanai, Hachiohji, both of Japan

[73] Assignee: Hitachi, Ltd., Tokyo, Japan

[21] Appl. No.: 240,561

[22] Filed: Mar. 4, 1981

[30] Foreign Application Priority Data

Apr. 4, 1980 [JP] Japan .................... 55-43577

[51] Int. Cl.$^3$ .................... B05D 3/06; H01L 21/203; H01L 21/263; H01L 21/268
[52] U.S. Cl. .................... 427/35; 427/43.1; 427/53.1; 427/255.1
[58] Field of Search .................... 427/35, 53.1, 43.1, 427/255.1

[56] References Cited

U.S. PATENT DOCUMENTS

| | | | |
|---|---|---|---|
| 3,585,088 | 6/1971 | Schwuttke et al. | 427/53.1 X |
| 4,059,461 | 11/1977 | Fan et al. | 427/53.1 X |
| 4,198,246 | 4/1980 | Wu | 427/35 X |

*Primary Examiner*—James R. Hoffman
*Attorney Agent or Firm*—Craig and Antonelli

[57] ABSTRACT

Herein disclosed is a method of fabricating a thick single-crystalline silicon film at a low temperature less than 1000° C. The method is characterized in that, simultaneously as silicon polycrystals are grown on a substrate to form polycrystalline silicon, said polycrystals are irradiated and annealed with a laser or electron beam so that said polycrystalline silicon is single-crystallized to fabricate a single-crystalline silicon film.

7 Claims, 19 Drawing Figures

METHOD OF FABRICATING SINGLE-CRYSTALLINE SILICON FILMS

BACKGROUND OF THE INVENTION

The present invention relates to both a method of fabricating a single-crystalline silicon film with the use of a laser or electron beam and an apparatus for performing the method.

A single-crystalline silicon film to be used in a semiconductor device is usually fabricated by a CVD (i.e., Chemical Vapor Deposition) method or an evaporation method. There has recently been proposed a method, in which a silicon film of a non-single-crystalline type is irradiated with a laser or electron beam so that the film is annealed to form a single-crystalline silicon film. On pages 116 to 152 of *NIKKEI ELECTRONICS* published in Japan on June 6, 1979, for example, there is found a description that an amorphous thin silicon layer is formed on the surface of a single-crystalline substrate and is irradiated with a laser so that the amorphous layer can be epitaxially formed as a single crystalline layer on the substrate. On pages 64 to 71 of *Electronic Materials* published in Japan in November, 1978, moreover, there is also found a description that, if a semiconductor surface layer of silicon is placed for a short time period in a melted condition by an electron beam in an annealing treatment, the melted region is epitaxially recrystallized from the interface of the substrate and the melted region to form a single-crystalline layer.

The annealing methods using the laser and electron beams are different in that the laser utilizes optical energy; whereas the electron beam utilizes electrical energy, but the methods are identical in that the non-single-crystalline surface layer is annealed in a liquid phase while maintaining a sample (i.e., a semiconductor material) as a whole at a low temperature. According to these annealing methods, the various disadvantages, which have caused problems in the conventional annealing method in an electric furnace, due to the annealing treatment at a high temperature, for example, the crystal defect, the contamination and the impurity diffusion from the higher doped substrate can be reduced effectively.

In an annealing method using a laser or an electron beam (which beam will be referred to as "the laser or the like"), however, there is a limit in the thickness of the surface layer, which makes the annealing treatment possible, in accordance with the output energy level of the laser or the like. The inventors have effected single-crystallization of a polycrystalline silicon film, formed on a single-crystalline substrate by an experimentally prepared laser device, and have confirmed that it is difficult to form excellent single-crystals on the polycrystalline silicon film over all of the film thickness, if the thickness of the polycrystalline silicon film exceeds 5000 Å. Therefore, in order that a single-crystalline silicon film having such a thickness, as is required for fabricating a semiconductor device, may be formed by an annealing method using the laser or the like, both the step of forming a substrate with a polycrystalline silicon film having a thickness smaller than the annealable thickness and the step of irradiating and annealing the polycrystalline silicon film formed with the laser or the like so that the polycrystals may be single-crystallized are to be repeated several times. Each time the growth of the polycrystals and the irradiation with the laser or the like are effected, however, the substrate has to be brought into and out of the CVD device (or evaporation device) and the laser irradiating device so that the procedures therefor are remarkably complicated. Even if the insertion and take-out at the respective devices are not required, on the other hand, the work management of the conditions at the respective CVD or evaporation and laser irradiation steps becomes remarkably complex and tedious.

As a result, a method of fabricating a single-crystalline silicon film by an annealing treatment using the laser or the like has not been completed, although theoretically and experimentally possible, to such an extent that the fabrication of such a thick single-crystalline silicon film, as is required by a semiconductor device, is put into practice and that the aforementioned various advantages resulting from the laser annealing method can be substantially attained.

SUMMARY OF THE INVENTION

It is, therefore, an object of the present invention to provide a method for fabricating a single-crystalline silicon film wherein a single-crystalline silicon film having a desired thickness can be fabricated under a low temperature with ease and for a short time period, and to provide an apparatus therefor.

According to the present invention, simultaneously as polycrystals are grown on a substrate to form a silicon film, the polycrystals are irradiated with a laser or electron beam so that the polycrystals may be single-crystallized. These steps are performed continuously for a predetermined time period so that a single-crystalline silicon film having a desired thickness is fabricated.

A single-crystalline silicon film fabricating apparatus according to the present invention comprises a reactor for forming the surface of a substrate with a polycrystalline silicon film under a low temperature, and means disposed in the reactor for irradiating a desired region of the substrate surface with a laser or electron beam simultaneously with the formation of the aforementioned polycrystalline silicon.

The present invention will be described in connection with various embodiments thereof and with reference to the accompanying drawings, wherein:

DESCRIPTION OF THE PREFERRED EMBODIMENTS

Figure 1:
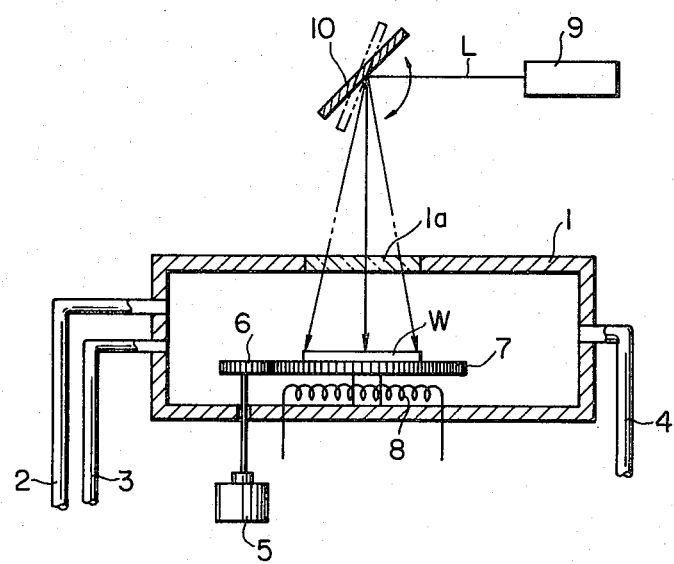
FIG. 1 is a schematic illustration for explaining a fabricating apparatus according to the present invention.

In FIG. 1 which illustrates a construction of a fabricating apparatus according to the present invention, reference numeral 1 indicates a reactor which is formed into the shape of a cylindrical container, for example. The reactor 1 has its one end connected with supply pipes 2 and 3 for introducing $N_2$ and $SiH_4$ gases, respectively, and its other end connected with a discharge pipe 4. The reactor 1 defines a hermetically sealed internal chamber. There is mounted in the chamber of the reactor 1 a sample table 7 which is rotated in a horizontal plane by a motor 5 and a gear mechanism 6 and on which a wafer W of a single-crystalline substrate to be used as a sample can be placed. Heating means 8 such as a resistance heater is disposed below the sample table 7 so that this table 7 can also serve as a heating table. As a result, the wafer W and the chamber in the reactor 1 can be heated by the heating table 7. The wall portion of the reactor 1 just above the heating table 7 is made of transparent quartz 1a.

Outside of the reactor 1 having the construction thus far described, there is arranged a laser emitter 9 having an optical axis, on which a rocking mirror 10 is so arranged that the laser beam L emitted from the emitter 9 is reflected by the rocking mirror 10 thereby to irradiate the surface of the wafer W placed on the heating table 7. The laser emitter 9 should not have its system especially restricted but is preferred to have an output power as high as possible. The rocking mirror 10 is so rocked in synchronism with the rotations of the heating table by the action of a drive means (not shown) that it irradiates, when rocked, the laser beam in a reciprocal manner in the diametrical direction of the heating table 7.

According to the construction thus far described, the reactor 1 is supplied with the $N_2$ gases and the $SiH_4$ gases through the supply pipes 2 and 3, respectively, while the reactor is purged through the discharge pipe 4. The wafer W placed on the heating table 7 is heated to a predetermined temperature so that the wafer has its surface formed with a polycrystalline silicon film. Simultaneously with this reaction, the wafer W is horizontally turned together with the heating table 7, and meanwhile the laser beam L emitted from the laser emitter 9 is reflected by the rocking mirror 10 to irradiate the wafer W through the transparent quartz window 1a, while being reciprocated in the diametrical direction, so that it irradiates the whole surface of the wafer W.

Embodiments of the method according to the present invention, which are based upon the operation of the apparatus, will be described in the following.

The wafer W of a single-crystalline substrate having a surface direction (100) serving as the sample is placed upon the heating table 7, and rotation of this heating table 7 is started. The reactor 1 is purged of gas through the discharge pipe 4, while being supplied with the $N_2$ gas at a flow rate of 30 l/min, and the silicon wafer W is heated to 650° C. by the heating means 8 after sufficient purge has been conducted. After a predetermined temperature has been reached, simultaneously as the reactor 1 is supplied with the $SiH_4$ gases at a flow rate of 50 cc/min through the supply pipe 3, the wafer W has its surface irradiated with the laser beam emitted from the laser emitter 9. A Q-switched YAG laser (which has a wavelength of 1.06 $\mu$m, an output of 20 W and a pulse width of 50 to 100 n sec) is used as the laser. The laser beam is made to uniformly irradiate, while scanning, the surface of the wafer W by the synchronizing movements between the rocking mirror 10 and the heating table 7. As a result, under this condition, polycrystalline silicon is grown on the wafer surface by the CVD method and is instantly annealed and single-crystallized by the irradiation with the laser so that a single-crystalline silicon film is grown on the wafer surface. If this operation is continued, single-crystalline silicon layers are consecutively formed on the wafer surface so that a silicon film having a large thickness can be formed. In the embodiment being described, these steps were continued for twenty minutes to fabricate a single-crystalline silicon film having a thickness of about 6 $\mu$m. This crystallization product was examined to reveal that a film quality similar to the silicon epitaxial growth obtainable by the usual CVD method could be attained.

In another embodiment, moreover, the growth of a similar single-crystalline silicon film was conducted by setting the flow rate of the $SiH_4$ gas at 150 cc/min. Then, it was confirmed that a growing rate of 1 $\mu$m/min was realized and that the growing rate of the single-crystalline silicon film was increased proportionately of the flow rate of the $SiH_4$ gases.

As has been described hereinbefore, in the method according to the present invention, since the wafer is disposed in the reactor so that a silicon layer is grown by the CVD method and is simultaneously irradiated with the laser so that it is single-crystallized, it is possible to fabricate a single-crystalline silicon film having a desired thickness with remarkable ease and to accomplish the fabrication at a temperature of not more than 1000° C., which is lower than the conventional single-crystallization method.

In case the initially formed polycrystalline silicon film is to be grown by the CVD method, more specifically, the growth is performed in accordance with the following reaction schemes and temperatures which are different in accordance with the kinds of reactive gases used:

$$SiH_4 \rightarrow Si(s) + 2H_2$$

~650° C. (e.g., in $N_2$ atmosphere or under low pressure)

$$SiH_2Cl_2 \rightarrow Si(s) + 2HCl$$

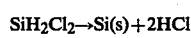
~700° C. (e.g., in $N_2$ atmosphere or under low pressure)

$$SiHCl_3 + H_2 \rightarrow Si(s) + 3HCl$$

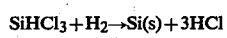
~750° C. (in $H_2$ atmosphere)

$$SiCl_4 + H_2 \rightarrow Si(s) + 4HCl$$

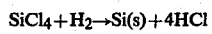
~850° C. (in $H_2$ atmosphere)

As a result, it is possible to perform the growth of the polycrystalline silicon film at a far lower temperature than the reaction temperature (of about 1000° to 1150° C.) which is required when the single-crystal is directly grown by the conventional CVD or evaporation method and to anneal the polycrystalline silicon film thereby to fabricate the single-crystalline silicon film.

By fabricating the single-crystalline silicon film under a low temperature condition, the following advantages can be achieved to make it possible: (1) to restrain the dislocation, which frequently takes place in the substrate under a high temperature condition, so that a crystal having little defect can be obtained; (2) to prevent the crystal from being contaminated with undesired gases occurring from the reactions at a high temperature thereby to prevent the stacking faults in a memory element; and (3) to prevent a newly grown crystal from being doped with an impurity from the substrate. Of these, the effect (3) of preventing the impurity doping can establish a steep profile of the impurity concentration between the substrate and the single-crystalline silicon film so that a variety of semiconductor devices having excellent characteristics can be produced.

According to the present invention, moreover, if the aforementioned polycrystalline growth can be effected while a limited portion of the wafer surface is being irradiated with the laser, only that limited portion will be annealed and single-crystallized for various applications.

According to the present invention, therefore, a single-crystalline silicon film having a large thickness can be fabricated with ease and for a short time period even under the low temperature condition in a manner to have a desired thickness and at a desired region of the wafer.

Incidentally, the method according to the present invention can be practiced substantially similar to the CVD method even in case the polycrystals are formed by the evaporation method. Moreover, the laser can be replaced by an electron beam. In either modification, the specific construction of the apparatus is more or less changed, but the basic construction and process are left unchanged.

A variety of semiconductor devices produced by use of the method according to the present invention will be hereinafter described together with the advantages thereof.

Figure 2A:
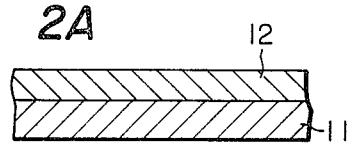
FIGS. 2A to 2F are sectional views at successive steps for explaining the method of fabricating a semiconductor device in accordance with one embodiment of the present invention.
Figure 2B:
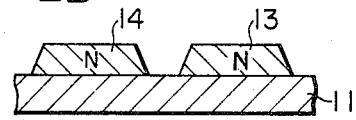
Figure 2C:
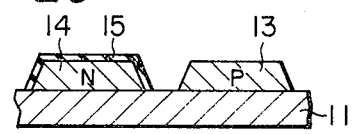
Figure 2D:
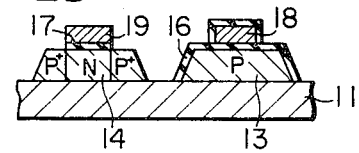
Figure 2E:
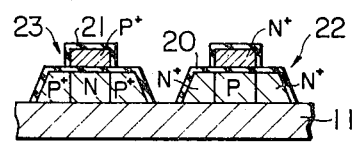
Figure 2F:
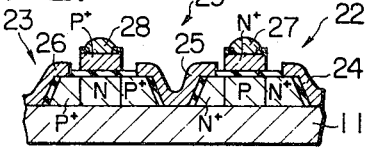

FIGS. 2A to 2F show an embodiment in which the present invention is applied to a semiconductor device having an SOS (i.e. Silicon-on-Sapphire) construction. As shown in FIG. 2A, when a single-crystalline silicon film 12 is to be formed on a sapphire substrate 11, the method according to the present invention is used to simultaneously grow and anneal polycrystalline silicon so that a single-crystalline silicon film having a relatively large thickness of 1.0 μm, for example, is fabricated under a low temperature condition. As shown in FIG. 2B, an N-type impurity is introduced into the single-crystalline silicon film 12 by a well-known technique and this film 12 is divided by the well-known etching technique. As shown in FIG. 2C, then, one island 14 of the silicon film is coated with an insulating film 15 of SiO$_2$ or the like, and a P-type impurity is introduced into the other island 13 so that the conduction of this island 13 is changed into a P-type. As shown in FIG. 2D, insulating films 16 and 17 made of SiO$_2$ for providing gate insulating films are prepared and formed with gate electrodes 18 and 19 of polycrystalline silicon by a well-known technique. Moreover, a P-type impurity is introduced into the island 14 thereby to form a pair of P+-type semiconductor regions. These paired P+-semiconductor regions serve as the source and drain of a P-channel MIS device. As shown in FIG. 2E, after removing the insulating film 16 except for the portion thereof beneath the gate electrode 18, an N-type impurity is introduced into the island 13 thereby to form a pair of N+-type semiconductor regions, which are used as the source and drain. After that, insulating films 20 and 21 are formed, as shown in FIG. 2E. Moreover, wiring connections 24 to 28 of aluminum are arranged as shown in FIG. 2F. Thus, a complementary MIS circuit 29 is fabricated which is composed of the P-channel MIS device indicated at 22 and the N-channel MIS device indicated at 23.

In the complementary MIS circuit 29 thus fabricated, the fabrication of the single-crystalline silicon film 12 is performed under the low temperature condition not exceeding 1000° C. As a result, the single-crystalline silicon film 12 can be prevented from being auto-doped with the aluminum making the sapphire substrate 11 (of Al$_2$O$_3$) thereby to improve the crystallization so that the current mobility can be made higher than the conventional film.

Figure 3A:
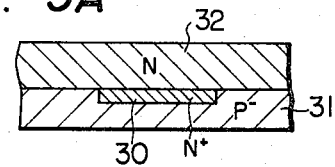
FIGS. 3A to 3E are sectional views at successive steps for explaining the method of fabricating a semiconductor device in accordance with another embodiment of the present invention.
Figure 3B:
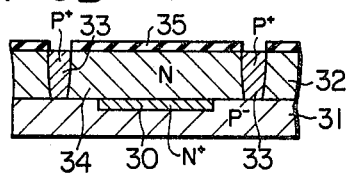
Figure 3C:
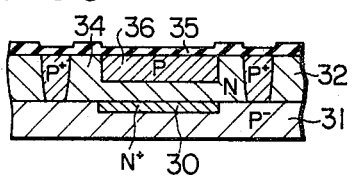
Figure 3D:
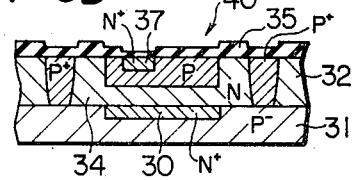
Figure 3E:
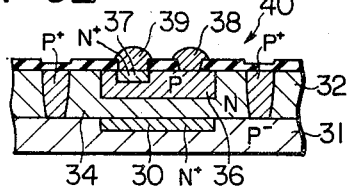

FIGS. 3A to 3E shows another embodiment, in which the present invention is applied to a bipolar IC. The method of the present invention is employed when a single-crystalline silicon film 32 is to be fabricated upon the P−-type silicon substrate 31 which is formed with a buried layer 30, as shown in FIG. 3A. The single-crystalline silicon film 32 is formed thereon and is provided with an insulating film 35 of SiO$_2$ or the like, as shown in FIG. 3B, which is used to introduce a P-type impurity thereby to form a P+-type isolation region 33. By this isolation region 33, the single-crystalline silicon film 32 is divided to form an island 34. As shown in FIGS. 3C and 3D, then, a P-type base region 36 and an N+-type emitter region 37 are formed by the well-known planer technique. After that, as shown in FIG. 3E, wiring connections or electrodes 38 and 39 of aluminum are formed. Thus, a bipolar transistor 40 is completed.

According to this method, since the auto-doping of the N-type layer acting as a collector from the buried layer 30 can be reduced by the low temperature treatment, excellent characteristics can be attained. Moreover, such an IIL (i.e., Integrated Injection Logic) as has been accepted as difficult to be produced by the auto-doping can be produced with ease.

Figure 4A:
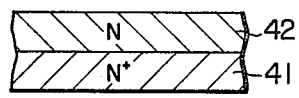
FIGS. 4A to 4D are sectional views at successive steps for explaining the method of fabricating a semiconductor device in accordance with a further embodiment of the present invention.
Figure 4B:
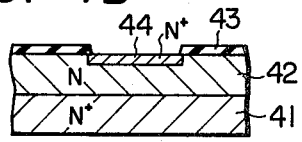
Figure 4C:
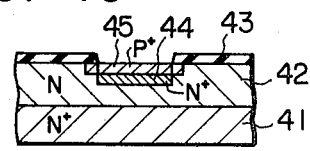
Figure 4D:
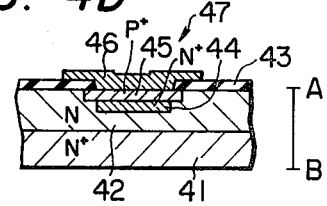

FIGS. 4A to 4D show an embodiment, in which the present invention is applied to a diode, especially, the Varicap (i.e., Variable Capacitance Diode). As shown in FIG. 4A, a single-crystalline silicon film 42 is formed on an N+-type silicon substrate 41 by the use of the method according to the present invention. Next, as shown in FIG. 4B, an insulating film 43 of SiO$_2$ is formed and used as a mask to form an N-type high impurity concentration region (i.e., an N+-type region) 44. After that, as shown in FIGS. 4C and 4D, a P-type high impurity concentration region (i.e., a P+-type region) 45 is formed, and an electrode 46 of aluminum is formed, thus fabricating a diode 47.

Figure 5:
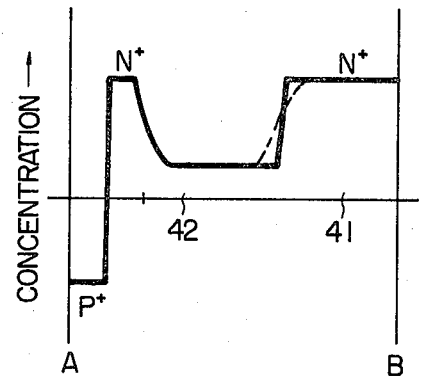
FIG. 5 is a graph illustrating the impurity concentration of the semiconductor device shown in FIGS. 4A to 4D.

The impurity concentration distribution in the diode thus fabricated is illustrated in FIG. 5. Since, in the diode fabricated according to the present invention, the auto-doping from the substrate 41 into the N-type layer 42 is restrained by the low temperature treatment, the impurity concentration in the vicinity of the boundary portion between the substrate 41 and the N-type layer 42 can be made to have a steeper profile than that according to the prior art, as shown in a broken line, thereby to effectively improve the characteristics.

Figure 6A:
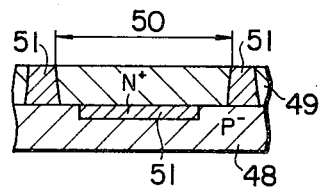
FIGS. 6A and 6B are sectional views at successive steps for explaining the method of fabricating a semiconductor device according to a further embodiment of the present invention.
Figure 6B:
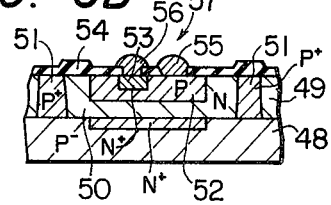

FIGS. 6A and 6B show an embodiment, in which only a portion 50 of a polycrystalline silicon film 49 grown on a substrate 48, i.e. a transistor forming portion, is irradiated and single-crystallized with the laser or the like when a bipolar IC is to be fabricated. As shown in FIG. 6A, the single-crystalline silicon portion 50 which is surrounded by a polycrystalline silicon portion 51 is formed. And, this single-crystalline silicon portion 50 is formed similarly to the embodiment of FIGS. 3A to 3E with a base diffused region 52 and emitter diffused region 53 and further with aluminum electrodes 55 and 56 extending over an insulating film 54, thus completing a bipolar transistor 57.

In this device, the aforementioned polycrystalline silicon portion 51 can be used as an isolation portion. In this transistor, therefore, the auto-doping from the substrate 48 can be reduced similarly to the embodiment of FIGS. 3A to 3E thereby to improve the characteristics. Moreover, since the isolation is effected at the polycrystalline silicon, the isolation withstand voltage can be improved, thus making it possible to fabricate an IC having a high withstand voltage.

In addition to the above, a variety of semiconductor devices can be fabricated by utilizing the method according to the present invention so that excellent characteristics can be attained.

As has been described hereinbefore, according to the single-crystalline silicon film fabricating method of the present invention, simultaneously as polycrystalline silicon is grown on a substrate to form a silicon film, this crystal is irradiated with a laser or electron beam so that it is single-crystallized, and these steps are performed continuously for a predetermined time period, thus making it possible to fabricate a single-crystalline silicon film having a desired thickness. As a result, a single-crystalline silicon film having a large thickness can be fabricated with ease and for a short time period even under the low temperature condition in a manner to have a desired thickness and at a desired region. Moreover, it is possible to prevent the crystal defect, the stacking faults and the doping with any impurity. The fabricating apparatus according to the present invention is equipped with both a reactor for forming a polycrystalline silicon film on the surface of a substrate under the low temperature condition and means for irradiating the substrate surface, i.e. polycrystalline silicon to be grown with a laser or electron beam simultaneously with the growth. As a result, a single-crystalline silicon film can be fabricated under the condition, in which the substrate is set in the reactor, so that the fabricating steps and efforts can be simplified.

What is claimed is:

1. A method of fabricating a single-crystalline silicon film comprising depositing a material of polycrystalline silicon on a substrate; and, at the same time as said material is deposited, irradiating said deposited material of polycrystalline silicon with a laser or electron beam to single-crystallize said material of polycrystalline silicon and to form a single crystalline silicon film.

2. A method as set forth in claim 1, wherein the deposition of said polycrystalline silicon material is performed under a temperature condition lower than 1000° C.

3. A method as set forth in claim 1 or claim 2, wherein both the deposition of said polycrystalline silicon material and the irradiation with said laser or electron beam are performed continuously for a predetermined time period until the single-crystalline silicon film having a desired thickness is fabricated.

4. A method as set forth in claim 1 or claim 2, wherein said deposited polycrystalline silicon material is irradiated substantially over the entire exposed surface thereof with said laser or electron beam.

5. A method as set forth in claim 1 or claim 2, wherein said deposited polycrystalline silicon material is irradiated only at a specified region thereof with said laser or electron beam.

6. A method as set forth in claim 1 or claim 2, wherein said polycrystalline silicon material is deposited by chemical vapor deposition with a gaseous mixture of $H_2$ or $N_2$ and a silicon hydride and said deposited polycrystalline material is irradiated with a laser beam.

7. A method as set forth in claim 1, wherein said single crystalline silicon film is formed to have a thickness in excess of 5000 Å.

* * * * *